United States Patent
Wiedenhoefer et al.

(10) Patent No.: US 10,802,467 B2
(45) Date of Patent: Oct. 13, 2020

(54) METHODS OF DEFINING INTERNAL STRUCTURES FOR ADDITIVE MANUFACTURING

(71) Applicant: GENERAL ELECTRIC COMPANY, Schenectady, NY (US)

(72) Inventors: James Fredric Wiedenhoefer, Clifton Park, NY (US); Brian Magann Rush, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 705 days.

(21) Appl. No.: 15/399,935

(22) Filed: Jan. 6, 2017

(65) Prior Publication Data
US 2018/0356794 A1 Dec. 13, 2018

(51) Int. Cl.
| | | |
|---|---|---|
| G05B 19/4097 | (2006.01) | |
| B29C 64/393 | (2017.01) | |
| B33Y 50/02 | (2015.01) | |
| G06F 30/00 | (2020.01) | |

(52) U.S. Cl.
CPC ........ G05B 19/4097 (2013.01); B29C 64/393 (2017.08); B33Y 50/02 (2014.12); G06F 30/00 (2020.01); G05B 2219/49018 (2013.01)

(58) Field of Classification Search
CPC ................................................ G05B 19/4097
USPC ............................................................. 703/1
See application file for complete search history.

(56) References Cited

U.S. PATENT DOCUMENTS

| | | | |
|---|---|---|---|
| 7,704,565 B2* | 4/2010 | Slaughter .............. | B22F 3/1055 355/53 |
| 8,323,122 B2 | 12/2012 | Soracco et al. | |
| 8,610,761 B2* | 12/2013 | Haisty .................. | H04N 9/3147 348/51 |
| 9,789,651 B2* | 10/2017 | Musuvathy ............. | G06F 30/17 |
| 10,395,372 B2* | 8/2019 | Anand .................... | G06T 19/20 |
| 2003/0197708 A1* | 10/2003 | Frisken ..................... | G06T 5/50 345/582 |
| 2004/0107019 A1* | 6/2004 | Keshavmurthy ....... | G06F 19/00 700/118 |
| 2008/0315461 A1* | 12/2008 | Henningsen ........... | B33Y 40/00 264/401 |

(Continued)

OTHER PUBLICATIONS

NandKumar Siraskar(Adaptive Slicing in Additive Manufacturing Process using a Modified Boundary Octree Data Structure, University of Cincinnati, 2012, pp. 1-78). (Year: 2012).*

(Continued)

*Primary Examiner* — Iftekhar A Khan
(74) *Attorney, Agent, or Firm* — Armstrong Teasdale LLP

(57) ABSTRACT

The present disclosure provides methods of defining internal secondary structures of an object to be formed at least in part by additive manufacturing. The object may include a primary structure having a volume. The methods may include applying a balancing parameter within an axis-aligned bounding box that encompasses the primary structure. The methods may further include refining the balancing parameter until the volume is delimited into a plurality of the internal structures. The plurality of internal structures may be oriented at an angle to a global z-axis that is substantially parallel to a build direction, such as angled in a range of 40 degrees to 70 degrees to the z-axis.

15 Claims, 9 Drawing Sheets

(56) References Cited

U.S. PATENT DOCUMENTS

| | | | | |
|---|---|---|---|---|
| 2009/0284528 A1* | 11/2009 | Jensen | .................... | G06T 17/00 345/420 |
| 2011/0087350 A1* | 4/2011 | Fogel | ...................... | G06T 19/00 700/98 |
| 2011/0270587 A1* | 11/2011 | Yamada | .................. | G06F 30/17 703/1 |
| 2013/0079693 A1 | 3/2013 | Ranky et al. | | |
| 2013/0264749 A1* | 10/2013 | Jones | ...................... | G06F 30/00 264/497 |
| 2013/0268085 A1* | 10/2013 | Dong | ........................ | A61F 2/28 623/23.5 |
| 2014/0031967 A1* | 1/2014 | Unger | .................... | B33Y 50/00 700/119 |
| 2014/0037873 A1 | 2/2014 | Cheung et al. | | |
| 2014/0163445 A1* | 6/2014 | Pallari | ............... | A61F 13/00055 602/43 |
| 2014/0321998 A1* | 10/2014 | Maar | ..................... | F01D 21/045 415/182.1 |
| 2015/0080495 A1* | 3/2015 | Heikkila | ................. | B22F 3/004 523/223 |
| 2015/0193559 A1* | 7/2015 | Musuvathy | ........... | B29C 64/386 703/1 |
| 2016/0019270 A1* | 1/2016 | Jones | ................. | G05B 19/4097 700/98 |
| 2016/0085882 A1* | 3/2016 | Li | ........................... | G06F 30/00 703/1 |
| 2016/0098495 A1* | 4/2016 | Dong | ................. | B23K 15/0086 219/76.12 |
| 2016/0175935 A1* | 6/2016 | Ladewig | .............. | B23K 26/042 425/78 |
| 2016/0221262 A1* | 8/2016 | Das | ........................ | B29C 64/40 |
| 2016/0297147 A1* | 10/2016 | Osawa | .................. | B29C 64/386 |
| 2016/0321384 A1* | 11/2016 | Pal | ........................... | G06F 30/23 |
| 2017/0083003 A1* | 3/2017 | Arisoy | .................... | G06F 30/00 |
| 2017/0266728 A1* | 9/2017 | Johnson | ............... | B22D 23/003 |
| 2017/0361536 A1* | 12/2017 | Garcia Reyero Vinas | .................. | G05B 19/4099 |
| 2018/0143147 A1* | 5/2018 | Milner | .................... | B22F 3/105 |
| 2018/0349531 A1* | 12/2018 | Morris | ................. | G05B 19/182 |
| 2018/0370125 A1* | 12/2018 | Rolland | ............... | G03F 7/0037 |
| 2019/0205499 A1* | 7/2019 | De Lange | ............. | B29C 64/393 |

OTHER PUBLICATIONS

Bharat Ramachandra Beltur ("Adaptive Slicing in Additive Manufacturing using Strip Tree Data Structures", University of Cincinnati, 2016, pp. 1-78) (Year: 2016).*

Brackett et al. ("Topology Optimization for Additive Manufacturing", 2011, Loughborough University, UK, pp. 348-362) (Year: 2011).*

Villalpando et al. ("An optimization approach for components built by fused deposition modeling with parametric internal structures", 2014, ScienceDirect, pp. 800-805) (Year: 2014).*

Tang et al. ("Bidirectional Evolutionary Structural Optimization (BESO) based design method for lattice structure to be fabricated by additive manufacturing", Computer-Aided Design 69 (2015) 91-101) (Year: 2015).*

Vaidya et al. ("Image Processing Assisted Tools for Pre- and Post-Processing Operations in Additive Manufacturing",Procedia Manufacturing vol. 5, 2016, pp. 958-973) (Year: 2016).*

Brackett et al. ("Topology Optimization for Additive Manufacturing", Loughborough University, 2011, pp. 348-362) (Year: 2011).*

Brackett et al.,"Topology Optimization for Additive Manufacturing", Wolfson School of Mechanical and Manufacturing Engineering, Loughborough University,Aug. 17, 2011,pp. 348-362, Loughborough, Leicestershire, LE11 3TU, UK.

Brotan.V et al., "The hybrid manufacturing cell: Determining key parameters in the integration of powder bed fusion with high speed milling", Industrial Engineering and Engineering Management (IEEM), 2012 IEEE International conference on, Dec. 10-13, 2012, pp. 583-587, Location :Hong Kong.

* cited by examiner

METHODS OF DEFINING INTERNAL STRUCTURES FOR ADDITIVE MANUFACTURING

GOVERNMENT LICENSE RIGHTS

This application was made with U.S. Government support under Agreement No. N66001-15-C-4002 awarded by the Defense Advanced Research Projects Agency (DARPA). The government has certain rights in the invention.

FIELD OF THE INVENTION

The field of the present disclosure relates generally to the field of additive manufacturing and, more specifically, to generating internal structures for additively manufactured objects.

BACKGROUND OF THE INVENTION

Additive manufacturing is an established but growing technology. Broadly, additive manufacturing is any layer-wise construction of objects from relatively thin layers of feed material. Though "additive manufacturing" is an industry standard term (ASTM F2792), as used herein "additive manufacturing" encompasses various manufacturing and prototyping techniques known under a variety of names, including freeform fabrication, 3D printing, and rapid prototyping/tooling, among others. Additive manufacturing techniques are capable of fabricating complex components from a wide variety of materials, typically from a computer aided design (CAD) model. Additive manufacturing generally involves applying a layer of feed material over a substrate (such as a partially formed object or a seed object), and then sintering, curing, melting and/or otherwise joining at least a portion of the layer of feed material to the substrate based on the CAD model and CAD software, for example. This process is repeated numerous times to construct the desired finished component or object in a layer-by-layer fashion.

Some additive manufacturing processes use an energy beam, such as an electron beam or electromagnetic radiation such as a laser beam, to sinter and/or melt layers of powder feed material to create a three-dimensional object in which the particles of the powder feed material are bonded together. For example, direct metal laser sintering (DMLS) and direct metal laser melting (DMLM) additive manufacturing processes utilize a laser to heat the powder feed material via the laser to bond some the powder together. A laser beam is directed onto a controlled amount of feed powder material (e.g. metal powder) on the substrate to form a layer of bonded particles thereon. By moving the laser beam relative to the substrate along a predetermined path according to the CAD model and CAD software, often referred to as a scan pattern or executable build file, the layer may be defined in two dimensions on the substrate, for example. Scan patterns often include parallel scan lines, also referred to as scan vectors or hatch lines, and the distance between two adjacent scan lines is often referred to as hatch spacing. The hatch spacing is usually less than the diameter of the laser beam to achieve sufficient overlap to ensure complete sintering or melting of the powder material. Repeating the application of feed material and the movement of the laser along the scan pattern enables the layers of material to be deposited and then sintered or melted, thereby ultimately fabricating a three-dimensional object.

Some objects that may be produced by an additive manufacturing process have seemingly conflicting design requirements of being light in weight and having high stiffness or strength. Additionally, some such objects must meet stringent heat transfer constraints. To meet and balance weight, strength and heat tolerance/transfer requirements, some objects are designed as being partially hollow with interior structures, for support or otherwise, such as, but not limited to, interior structures forming a lattice. The interior volume of these objects may be formed of relatively lightweight, stiffening structures. The internal stiffening or support structures typically contain a multitude of length scales which, because of very high memory requirements and time requirements to define geometry, make it difficult to define the geometry using conventional CAD software.

Modeling or generating internal stiffening structures using conventional CAD tools typically requires the generation and insertion of thousands of connected solids within the internal volume of the object, usually cylinders or polyhedral columns. Since typical CAD tools maintain a topology of the internal volume, connecting every geometric entity, generating the internal structure, and converting the CAD file to a stereolithography (STL) file format or language therefrom (such as by replicating 3D unit cells in three orthogonal directions) typically uses excessive amounts of computer memory and requires substantial time for each update. For example, a CAD solid model converted to STL file format with a relatively small internal structure (about 100 um) for a relatively larger part (about 100 mm on a side) may be at least about 1 GB (potentially up to 1 TB or more) in size, which is too large for a typical computer workstation running an additive manufacturing software and hardware. Further, generating the internal structure and converting the CAD file to the STL file format, such as by replicating 3D unit cells in three orthogonal directions, can be limiting for arbitrarily shaped parts built in different orientations.

Therefore, a method of generating internal stiffening structures for additive manufactured objects that is readable by AM software and interpretable by additive manufactured hardware is desirable. A method for relatively quickly defining an internal structure for a volume in a relatively small sized output file, which can be interpreted using conventional additive manufacturing system software/hardware (e.g., DMLS and DMLM system software/hardware) is also desirable.

BRIEF DESCRIPTION OF THE INVENTION

In one aspect, the present disclosure provides for a method of defining a plurality of internal secondary structures of an object, to be formed at least in part by additive manufacturing, including a primary structure having a volume. The method includes applying a balancing parameter within an axis-aligned bounding box that encompasses the primary structure. The method further includes refining the balancing parameter until the volume is delimited into a plurality of the internal structures.

In some embodiments, the volume may include a tagged surface and at least one of the internal structures intersects the tagged surface. In some embodiments, the method may further include orienting a plurality of the internal structures at an angle to a global z-axis that is substantially parallel to a build direction. In some embodiments, the method may further include orienting the internal structures at an angle to the z-axis in a range of 40 degrees to 70 degrees. In some embodiments, the method may further include orienting the internal structures at an angle to the z-axis at an angle of about 55 degrees.

In some embodiments, at least some of the internal structures may form a lattice. In some embodiments, the balancing parameter may be an octree balancing parameter. In some embodiments, the refining may include applying an embedded Cartesian grid method. In some embodiments, the internal structures may be formed of one or more of a one-dimensional, two-dimensional, or three dimensional, and combinations thereof, beam element. In some such embodiments, a plurality of the beam elements form a lattice structure.

In some embodiments, the bounding box may be refined into cells using a maximum cell size and a minimum cell size. In some such embodiments, the volume may include a tagged surface, and at least one of the minimum-size cells may intersect a tagged surface. In some other such embodiments, one or more of the cells may have beam elements with end points that lie completely outside of the volume, and the method may further include trimming the outlying beam elements by moving the end points of these beam elements to a corresponding intersection. In some other such embodiments, one or more of the cells may form the beam elements. In some such embodiments, a plurality of the beam elements may be collinear and the method may combine several collinear beam elements into single beam elements.

In another aspect, the present disclosure provides for a method of defining a plurality of internal secondary structures of an object, to be formed at least in part by additive manufacturing, including a primary structure having a volume. The method includes applying a balancing parameter within an axis-aligned bounding box that encompasses the primary structure. The method further includes refining the balancing parameter until the volume is delimited into a plurality of the internal structures, whereby a plurality of the internal structures are oriented at an angle to a global z-axis that is substantially parallel to a build direction in a range of 40 degrees to 70 degrees. In some embodiments, the bounding box may be refined into cells using a maximum cell size and a minimum cell size, the volume may include a tagged surface, and at least one of the minimum-size cells may intersect a tagged surface. In some embodiments, one or more of the cells may form the beam elements. In some such embodiments, one or more of the cells may form beam elements that are collinear, and the method may combine several collinear beam elements into single beam elements.

BRIEF DESCRIPTION OF THE DRAWINGS

The various exemplary embodiments of the present disclosure, which will become more apparent as the description proceeds, may be described in the following detailed description in conjunction with the accompanying drawings, in which.

DETAILED DESCRIPTION OF THE INVENTION

The term "AM processes" (also, "additive manufacturing" or "additively manufactured") as used herein refers to any process which results in a three-dimensional object via sequential formation of the object in a layer by layer fashion. The description relates generally to AM processes as a rapid way to manufacture an object (e.g., any component, part or product). The additive layers or slices that are sequentially formed to build the object may be based on a three-dimensional description of the object. This description may be obtained from various sources such as a computer aided design (CAD) file(s), STL source files, or other types of source files.

The present disclosure provides methods for relatively quickly defining internal secondary structures, such as, but not limited to, lattice geometries, that may use a hierarchical refinement within a volume, such as within a cavity, of a primary structure of an additively manufactured object. A computer program product for facilitating additive manufacturing of the internal structures may utilize such a method. Further, an additive manufacturing system may utilize such a method to additively manufacture the internal structures.

The methods of the present disclosure may generate at least one output file specifying the internal structures (such as a hierarchical refined internal structure) via a plurality of geometric shapes that can be interpreted and utilized by additive manufacturing software. The additive manufacturing software may utilize one or more output files to direct associated additive manufacturing equipment to additively manufacture at least the primary structure of the object with the internal structures. The output files specifying the internal structures may be of a relatively small file size, which may facilitate file transfer with, and manipulation by, existing additive manufacturing software and hardware. For example, the output files may be substantially smaller than a corresponding file specifying the internal structures generated by converting a CAD solid model of the internal structures to STL file format. In use, the internal structures may provide strength and stiffness to the primary structure of the object, while limiting the weight of the object. The internal structures may also improve the heat transfer ability of the primary structure of the object (as compared to the primary structure without the internal structures).

Figure 1:
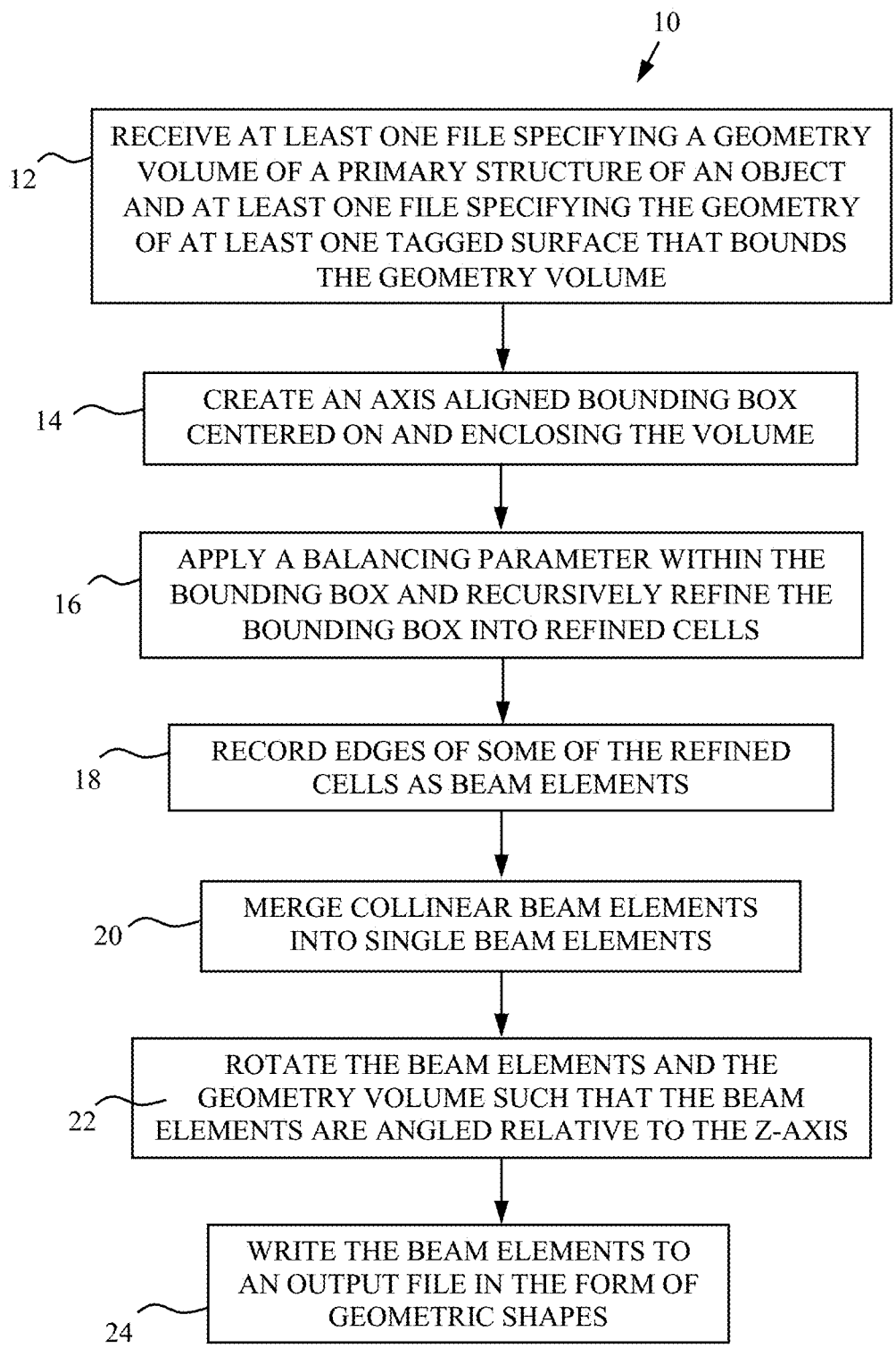
FIG. 1 depicts a flow diagram of a method encompassing certain aspects of the present disclosure.

One embodiment of the method or process 10 of generating or defining the plurality of internal secondary structures for a volume of a primary structure of an object for facilitating additive manufacturing thereof is shown in FIG. 1. The method 10 may initially receive 12 at least one file that specifies the volume to fill with the internal structures. The volume may be the geometry of a cavity of the primary structure of the object, and may be specified in three dimensions (e.g., specified in the x, y and z dimensions). The primary structure of the object may be a portion of the object that defines at least the volume.

As shown in FIG. 1, the method may also receive 12 at least one file that specifies at least one tagged surface that bounds the volume (e.g., a surface of the primary structure that bounds its cavity). The term "tagged" as used herein with reference to a surface that bounds the volume refers to a surface that includes a unique identifier associated therewith. The tagged surfaces may be specified in three dimensions (e.g., x, y and z). The tagged surfaces that bound the volume may have been tagged by a user (e.g., a unique identifier associated therewith), and the method may utilize tagged surfaces to guide the hierarchical refinement of the internal structures, as explained further below. In addition to the tagged surfaces of the primary structure of the object that bound the volume, the received files may also specify each of the other surfaces that bound the volume (e.g., tagged and non-tagged surfaces).

The tagged surfaces and the volume may be specified by the same file or by different files. For example, the tagged surfaces and the volume may be specified by respective files of differing file formats. In one embodiment, files that specify the volume may be in STL format, and other files that specify the tagged surfaces may be a CAD file.

As shown in FIG. 1, the method 10 may utilize the volume by creating 14 an axis-aligned, three-dimensional bounding box containing the entirety of the volume of the primary structure of the object. The term "bounding box" as used herein refers to a virtual boundary having a shape, e.g. cuboid, that fully contains the volume of the primary structure of the object. The bounding box may be centered on the volume. The method 10 may recursively subdivide and adaptively refine the bounding box into a plurality of cells that can be utilized to specify the internal structures.

As shown in FIG. 1, the method 10 applies 16 a balancing parameter within the bounding box and recursively and adaptively refines the bounding box into refined cells based on a number of factors or considerations according to a hierarchal refinement method, such an embedded Cartesian grid method. In some embodiments, the refinement may be based on a predetermined targeted maximum cell size, a predetermined targeted minimum cell size, the balancing parameter and the at least one tagged surface such that refined cells of the minimum cell size intersect at least one tagged surface. In some embodiments, at least some of the refined cells may be the same size and/or the same shape. For example, in some embodiments each of the refined cells may be a cubic cell. In some other embodiments, the refined cells may include cells of differing sizes and/or differing shapes.

The targeted maximum cell size may be the default or largest potential refined cell size in the volume (e.g., the largest dimension of the segments of the internal structures). The tagged surfaces are utilized to adaptively refine the cells based on the specific geometry or configuration of the volume or primary structure. For example, the refined cells that touch or intersect the tagged surfaces that bound the volume may be recursively refined until the targeted minimum cell size is reached. As noted above, the tagged surfaces may have been previously identified by a user.

Once refined cells of the predetermined targeted minimum cell size are formed (e.g., at least one tagged surface intersects cells of the predetermined targeted minimum cell size), the method 10 may balance the cells according to one or more balancing parameters. The balancing parameter may be utilized to control the rate of cell size transition between neighboring cells to form a hierarchy extending from the cells of the targeted minimum cell size. For example, the balancing parameter may be a 2:1, 4:1, 8:1 or any other restriction on the rate of cell size transition between neighboring cells. In some embodiments, the balancing parameter may be an octree balancing parameter. In some embodiments, mesh density controls may also be applied to further guide the refinement of the cells. For example, the density and/or size of cells at particular locations within the volume may be controlled or dictated.

The method 10 may utilize the refined cells to generate the internal structures, which may form a hierarchal lattice structure. As shown in FIG. 1, the method 10 may record 18 edges of some of the refined cells as beam elements that form the internal structures. The term "beam element" as used herein refers to a virtual representation, e.g., a one-dimensional representation, of at least a portion of the internal structures. For example, edges of the refined cells that extend between adjacent planar surfaces of the cells may be recorded as beam elements. Duplicate edges of the refined cells (e.g., any duplicate beam elements) may not be recorded 18 as beam elements (e.g., the method 10 may ignore duplicate edges). Edges of the refined cells that are positioned fully outside the specified volume may also not be recorded 18 as beam elements (e.g., are ignored). In this way, duplicate edges and edges that are not positioned at least partially within the volume may be ignored by the method 10 and not recorded 18 as beam elements.

In some embodiments, the method 10 may trim recorded beam elements which intersect a boundary surface of the geometry. For example, beam elements that intersect a boundary surface of the geometry may include an exterior end point that is positioned outside of the volume. Such a beam element may be trimmed by moving the exterior end point to the intersection point of that beam element and the volume. Trimming a beam element that intersects the volume may thereby include ignoring a portion thereof that lies outside the volume by defining a new endpoint at the intersection of the beam element and the volume.

As shown in FIG. 1, the method 10 may merge 20 collinear (e.g. aligned and abutting) beam elements into single, relatively longer beam elements. The merging 20 of collinear beam elements may be performed subsequent to recording 18 all of the unduplicated, interior beam elements and/or the trimming of any beam elements. In some embodiments, the method 10 may merge collinear beam elements by connecting the endpoints of multiple collinear beam elements to form single relatively longer beam elements with two endpoints.

The recorded, trimmed and merged beam elements, as a whole, may represent the hierarchal internal structures. To ensure the internal structures have sufficient underlying support to be additively manufactured, the method 10 may rotate or orient 22 the beam elements and the volume (e.g., about the x-y vector) such that the beam elements are angled relative to a global z-axis. In some embodiments, before the method 10 rotates 22 the beam elements they may be aligned with global x, y and z axes. The "global z-axis" or "z-axis" represents a direction that is substantially parallel to a build direction or build axis of an AM apparatus. In some embodiments, the method 10 may rotate 22 the recorded and merged beam elements, and the volume, (e.g., within the range of about 30 degrees and about 50 degrees) so that the beam elements have an angle relative to the z-axis that is within the range of 40 degrees to 70 degrees. Some embodiments of the beam elements are angled relative to the z-axis in the range of 50 degrees to 60 degrees, and others are angled in the range of 45 degrees to 55 degrees. In one embodiment, the beam elements and the volume are oriented so that the beam elements are all uniformly angled relative to the z-axis at about 55 degrees to the z-axis. When uniformly angled relative to the z-axis at about 55 degrees, the beam elements may advantageously include substantially the same amount of underlying support.

In some embodiments, in addition to rotating the beam elements and the volume, the method 10 may also rotate the geometry of surfaces that bound the volume (including the at least one tagged surface) to the same orientation as the rotated beam elements and volume. In this way, the beam elements, the volume, and the geometry of surfaces that bound the volume may be equally rotated or reoriented to maintain their relative orientations.

Figure 2:
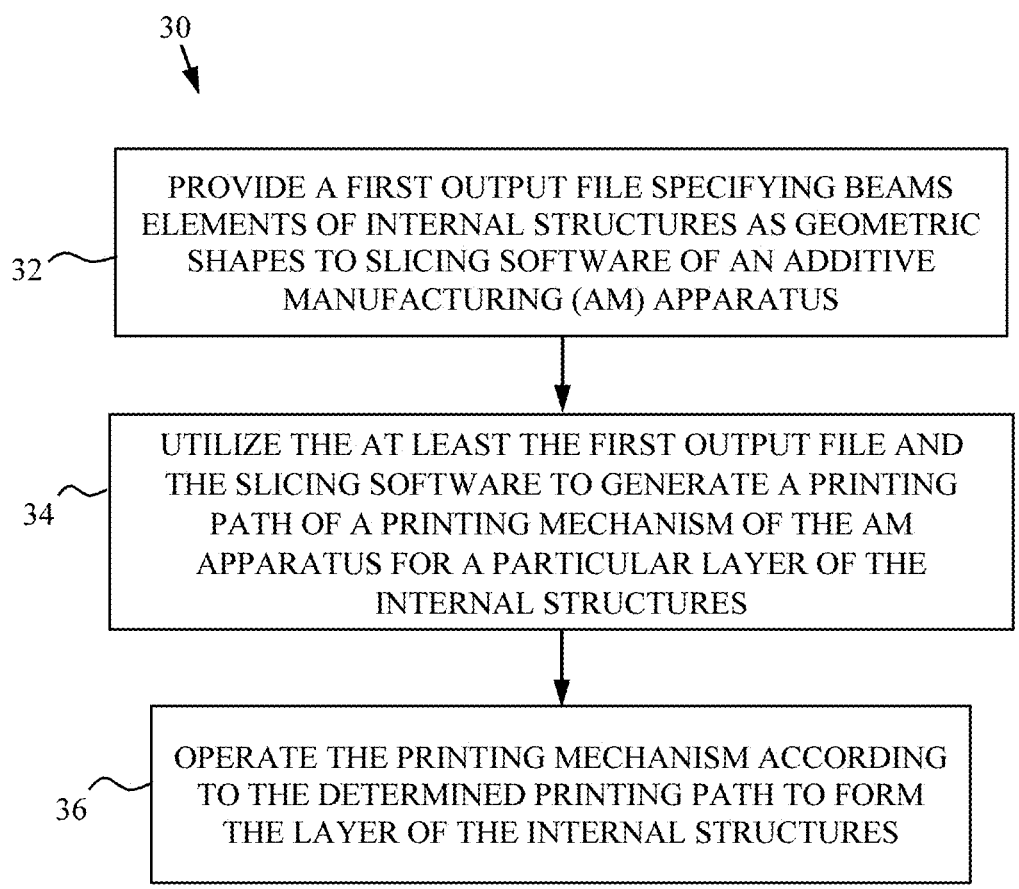
FIG. 2 depicts another flow diagram of a method encompassing certain aspects of the present disclosure.

After the beam elements, the volume, and the surfaces that bound the volume are rotated such that the beam elements are angled relative to the z-axis (e.g., at about 55 degrees), the method 10 may write 24 the rotated beam elements to a first output file in the form of geometric shapes, as shown in FIG. 2. The method 10 may also write 26 the rotated volume to the first output file. In some embodiments, the method 10 may further write the rotated geometry of surfaces that bound the volume to a second output file. The first output file and/or the second output file may be any file type that is readable by an additive manufacturing slicing software. In some embodiments, the first output file (and/or second output file) may be in STL file format. However, in other embodiments the first output file and/or the second output file may be in a file format other than STL file format.

The method 10 may write 24 the beam elements in the form of one or more geometric shapes that are recognized by additive manufacturing slicing software and/or additive manufacturing hardware as a printable objects. The additive manufacturing slicing software may be any additive manufacturing slicing software capable of defining a printing path of an additive manufacturing apparatus from a source file. Differing additive manufacturing slicing software and/or additive manufacturing hardware may recognize differing geometric shapes as printable objects (e.g., may recognize differing geometric shapes as non-printable objects). In some embodiments, the additive manufacturing hardware/slicing software may be predetermined or preselected. In this way, the method 10 may be tailored to output only geometric shapes that are recognized by a desired additive manufacturing hardware/slicing software.

Geometric shapes that are and are not recognized as a printable objects by an additive manufacturing slicing software/hardware may vary between differing software/hardware. For example, method 10 may write 24 each beam element in the form of two points (a zero-dimensional geometry), a one-dimensional line segment, a two-dimensional ribbon, a three-dimensional solid beam, or a combination thereof if they are recognizable as printable objects. In one embodiment, the method 10 may write 24 the beam elements in the form of pairs of triangular shapes that form a ribbon-like shape including a centerline corresponding to each beam element. In some embodiments of the method 10 that includes recursively refining the bounding box into refined cells based on, in part, an octree balancing parameter, the method 10 may write 24 the beam elements to the first output file as two-dimensional ribbons and/or three-dimensional solid beams.

Some current AM software and AM processes utilize an input file specifying 3D solid geometry (e.g., in STL file format) of internal support structures and "slice" it into cross-sections for calculating the pathway of an associated AM printing mechanism, such as a laser trace. In generating the cross-section slice geometry, the current AM software converts the 3D solid geometry into a 2D surface. Such AM software will convert a 2D surface geometry into a 1D line segment, and 1D lines into a 0D point. However, such AM software does not accept or recognize a 0D point for calculating printing pathways in a slice cross-section, but rather ignores 0D points. Therefore, the minimum surface geometry recognized by such AM software for calculating printing pathways is a 1D line. If the length of a 1D line segment is smaller than the printing capability of the associated AM apparatus, such as a laser spot size (e.g., 100 um), the 1D line segment is effectively a 0D point. In some embodiments, the method 10 may write 24 the beam elements to the first output file as two-dimensional ribbons each formed by a pair of triangles. The 3D solid geometry specifying the support structures typically utilized by current AM processes require at least ten total triangles to represent the support structures. As such the method 10 may provide for an output file that is smaller by at least a factor of five than current processes.

The first output file specifying the beam elements in the form of printable geometric shapes (and specifying the volume) may be utilized, at least in part, by additive manufacturing system software/hardware (e.g., DMLS and DMLM system software/hardware) to additively manufacture at least a primary structure of the object with the internal structures. For example, a method 30 of utilizing at least the first output file (and, potentially, the second output file) generated via the method 10 described above to additively manufacture a primary structure of an object with internal structures may provide 32 the first output file to slicing software of an AM apparatus, as shown in FIG. 2. Providing 32 the first output file to the slicing software may include making the first output file available to the slicing software. The method 30 may also provide (e.g., making available) the second output file specifying the geometry of surfaces that bound volume (including the at least one tagged surface) to the slicing software of the AM apparatus.

As shown in FIG. 2, the method 30 may utilize 34 the slicing software of the AM apparatus to generate a printing path of a printing mechanism thereof for a particular layer of the internal structures via at least the first output file. The printing path of the printing mechanism may correspond to portions of the geometric shapes specifying the internal structures (as specified in the first output file) at the particular layer. The method 30 may then utilize 36 the software of the associated AM apparatus to operate the printing mechanism according to the printing path to form a layer of at least the internal structures from source material (e.g., metal powder). As noted above, the relative angular orientation of the beam elements of the internal structures relative to the z-axis (e.g., the build axis of the AM apparatus) ensures that newly added portions of the beam elements have adequate underlying support for formation in a layer by layer fashion.

Figure 3A:
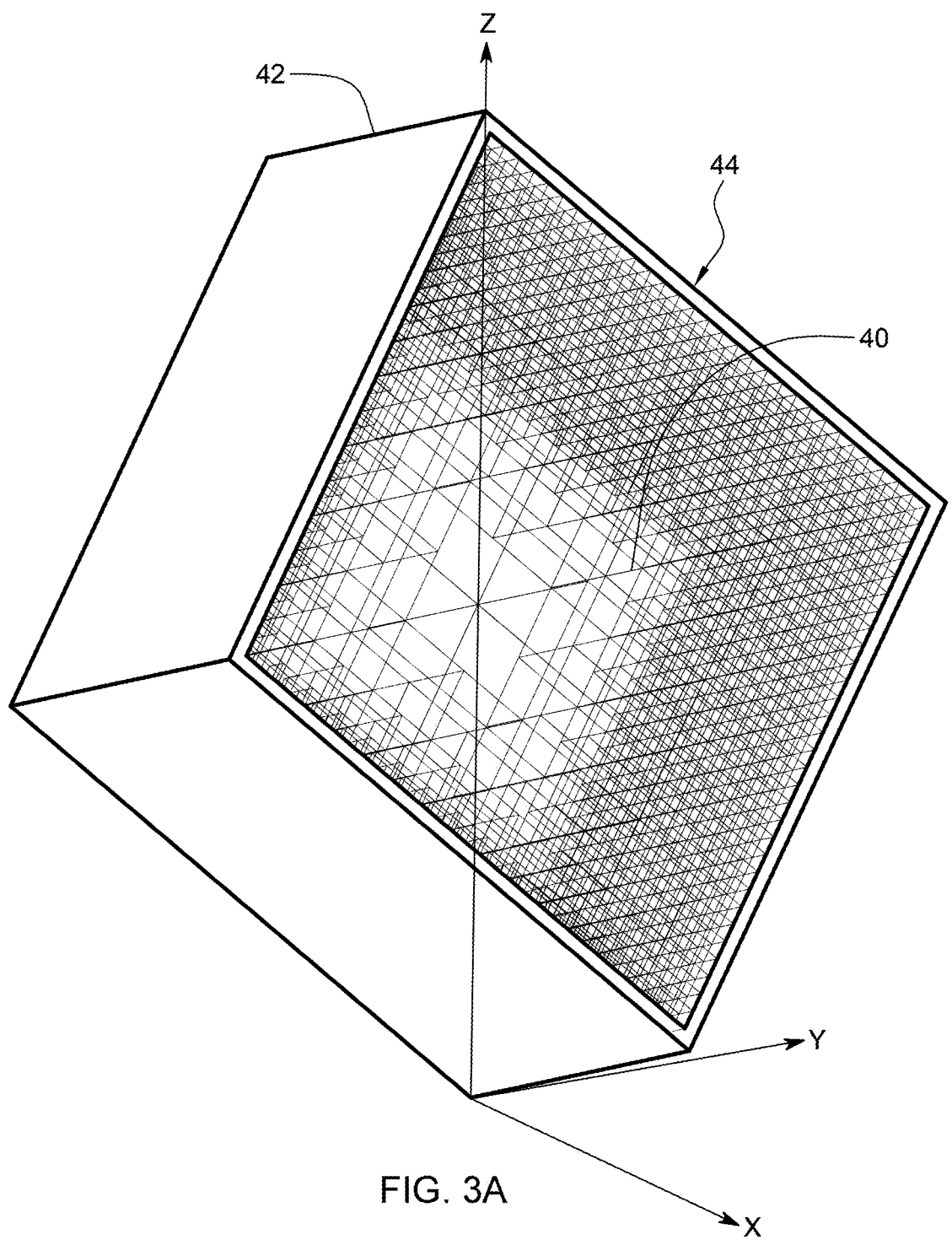
FIGS. 3A and 3B illustrate perspective and cross-sectional views, respectively, of beam elements within an object generated according to the present disclosure.
Figure 3B:
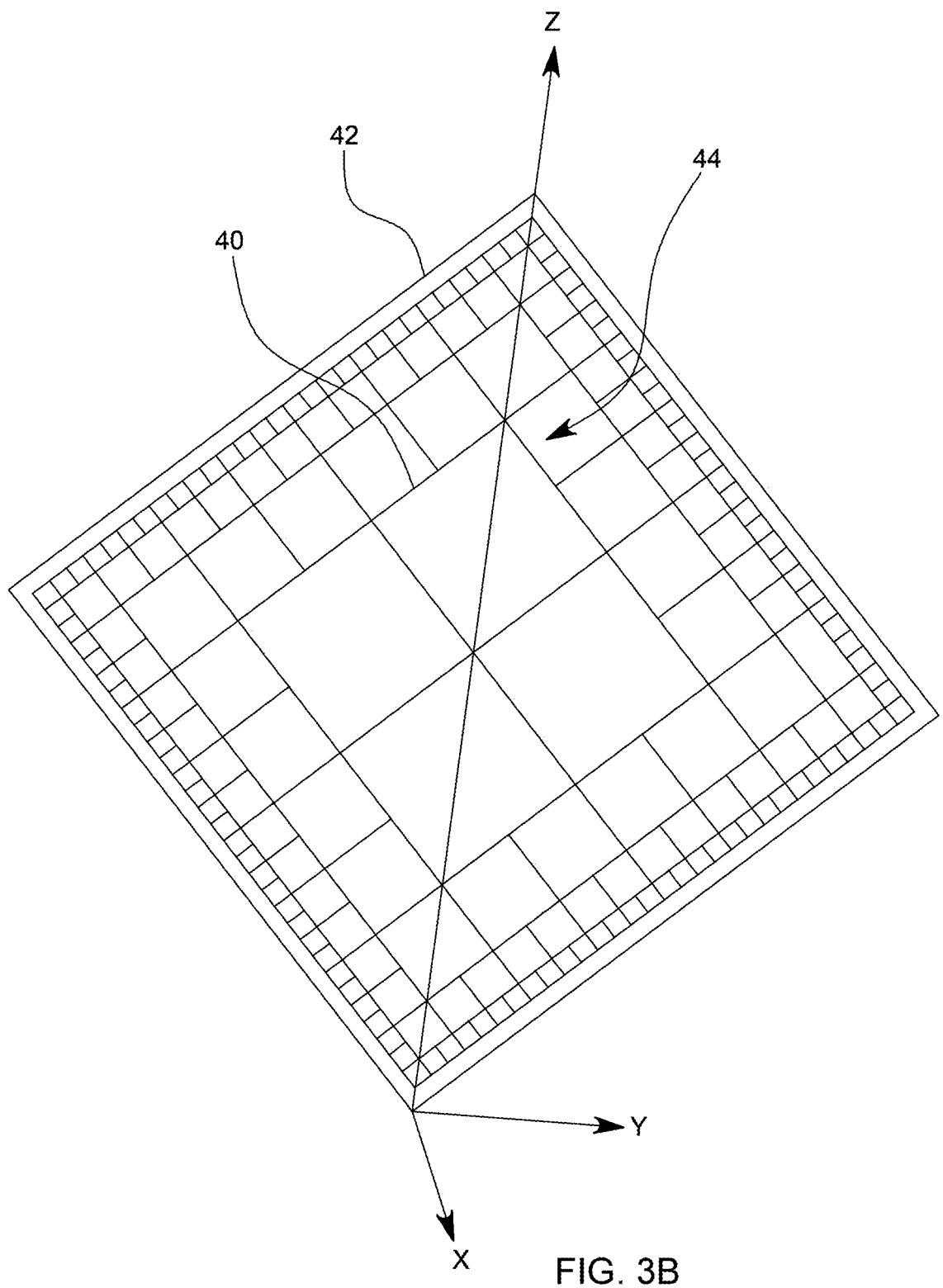

FIGS. 3A and 3B illustrate an example of beam elements 40 formed within a volume of a primary structure of an object 42 generated by the method 10 described above. FIGS. 3A and 3B illustrate recorded, merged and rotated beam elements within the volume 44 of the object 42. As shown FIGS. 3A and 3B, the beam elements 40 were adaptively refined to the cubic volume 44 of the primary structure of the object 42. The four boundaries or walls of the object 44 defining the cubic volume 44 were tagged boundary surfaces such that the cells of the predetermined targeted minimum cell size intersect the four walls. As also shown in FIGS. 3A and 3B, the beam elements 40 and the volume 44 were rotated so that the beam elements were angled relative to the z-axis to ensure that the corresponding internal structures have adequate underlying support for the layer-by-layer sequential formation thereof.

Figure 4A:
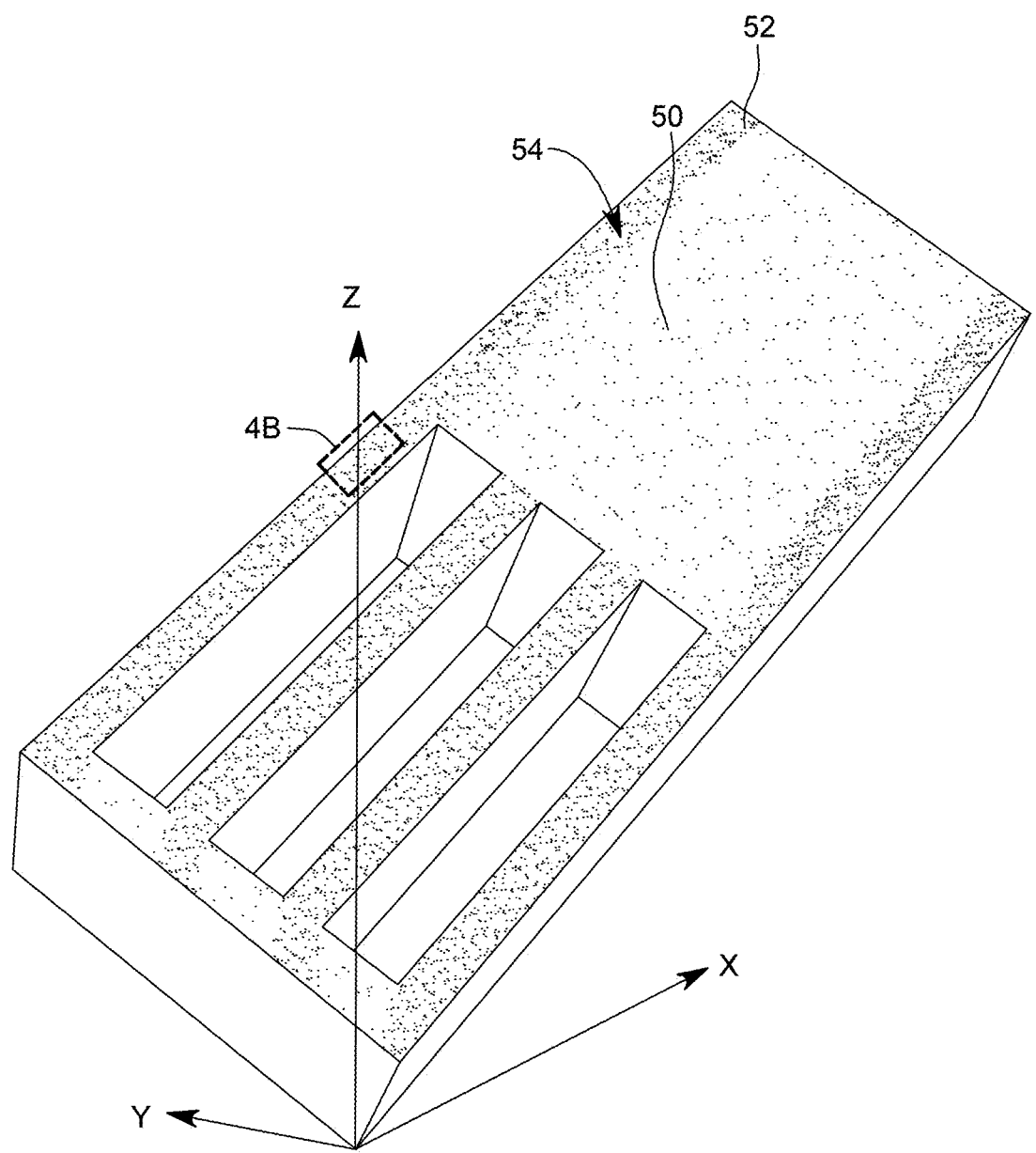
FIGS. 4A and 4B illustrate perspective views of internal structures within an object generated according to the present disclosure.
Figure 4B:
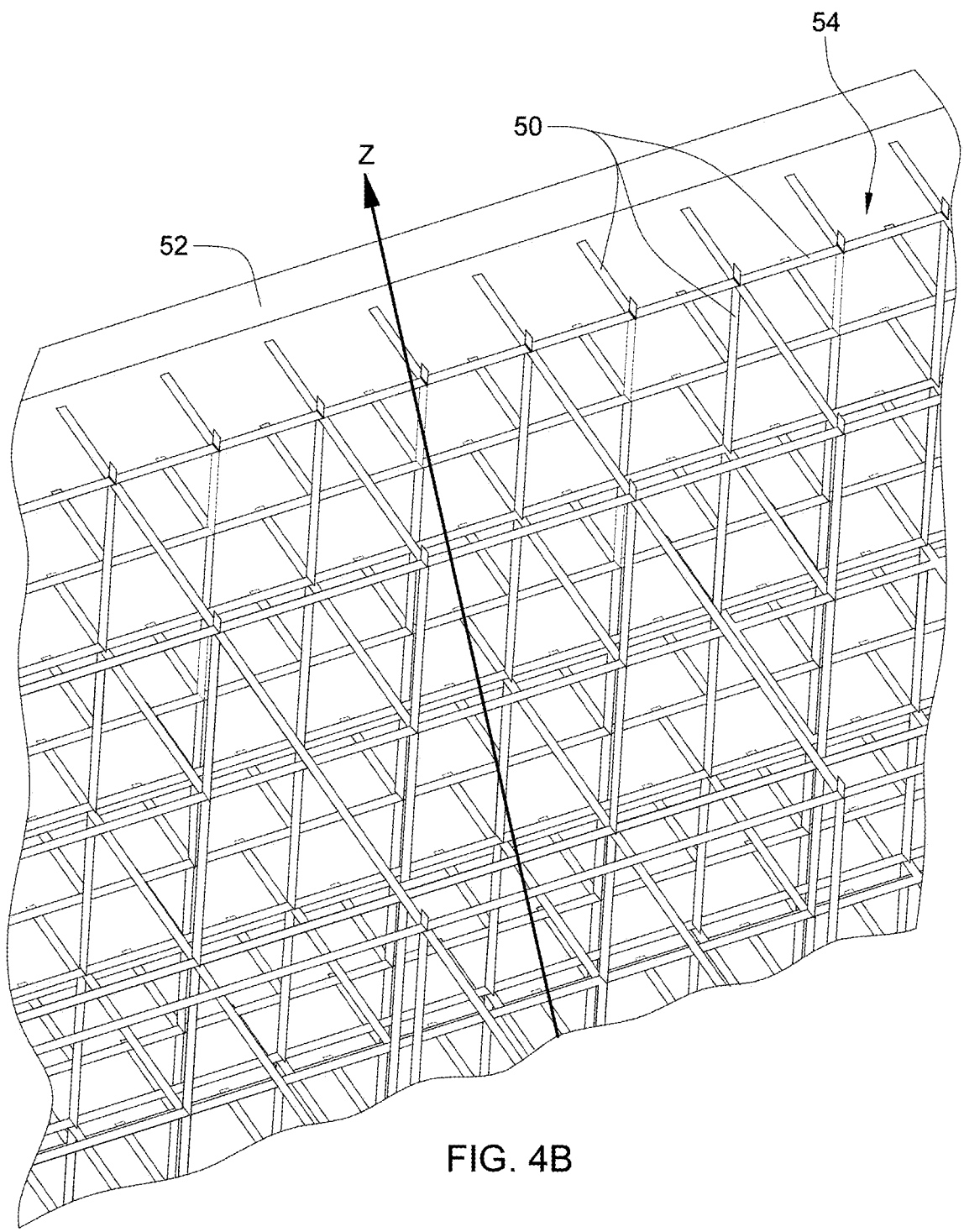

FIGS. 4A and 4B illustrate an example of internal structures 50 formed within a volume of a primary structure of an object 52 generated by the method 10 described above. FIG. 4B illustrates recorded, merged and rotated elements which were written as two-dimensional ribbons contained within an irregular or non-symmetrical volume 54 of the object 52. As shown FIGS. 4A and B, the internal structures 50 were adaptively refined to the volume 54 of the primary structure of the object 52 such that cells of the predetermined targeted minimum cell size intersect opposing boundaries or walls of the object 54 that define a portion of the volume 54. Such boundary surfaces were tagged boundary surfaces. As also shown in FIGS. 4A and 4B, the internal structures 50 were adaptively refined to the volume 54 such that relatively long walls extending along a length of the object 52 and between openings formed into or through the volume 54 intersect the cells of the predetermined targeted minimum cell size, and thereby the internal structures 50 are provide more densely in these areas as compared to the interior of the volume 54. As also shown FIGS. 4A and 4B, the internal structures 50 and volume 55 were rotated so that the beam elements were sufficiently angled relative to the z-axis (e.g., build plate) to ensure adequate underlying support.

Figure 5:
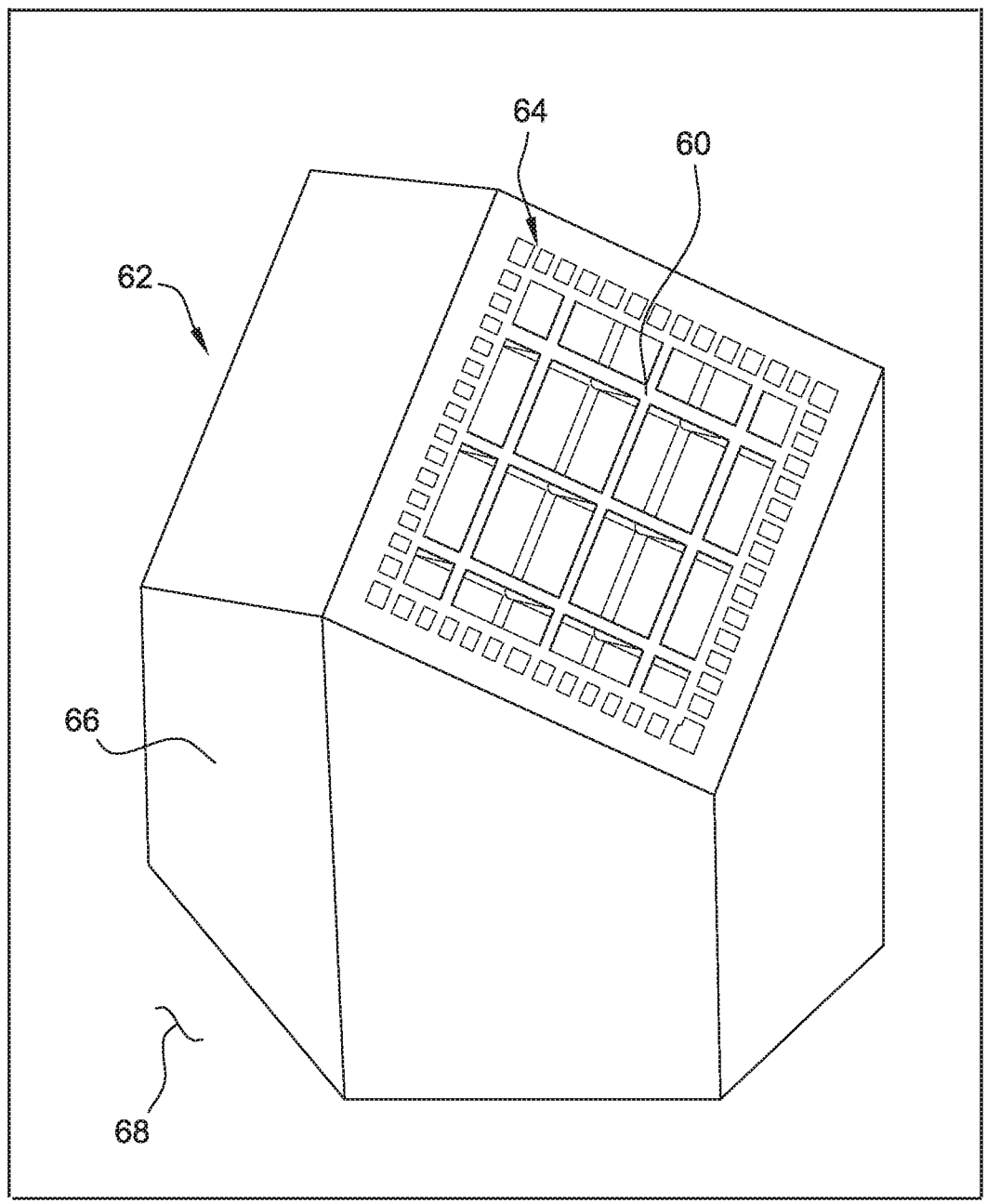
FIG. 5 illustrates a perspective view of internal structures within an object generated according to the present disclosure.

FIG. 5 is an image showing an additively manufactured object 62 with internal structures 64 formed within a volume 64 of a primary structure thereof. As shown in FIG. 5, the volume 64 of the primary structure of the object 62 includes a square or other quadrilateral-shaped cross-section. The internal structures 60 was adaptively refined to the volume 64 such that cells of the predetermined targeted minimum cell size intersect the outer walls of the object 62 (e.g., the outer walls were the tagged surfaces), as shown in FIG. 5. As also shown FIG. 5, the internal structures 64 was rotated so that the beam elements were angled relative to the build plate 68 (e.g., angled relative to the z-axis) to ensure that they had adequate underlying support. The object 62, as shown in FIG. 5, also includes a support structure 66 that extends between the object 62 and the build plate 68. The support structure 66 was configured to orient the object 62 with respect to the build plate 68 such that at least the beam elements of the internal structures 60 were angled relative to the build plate 68, as described above. In some embodiments, the support structure 66 may be removed from the object 62 after the object is formed.

Those having ordinary skill in the art will recognize that aspects of the present disclosure may be embodied in system(s), method(s) and/or computer program product(s). In some embodiments, aspects of the present disclosure may be embodied entirely in hardware, entirely in software (for instance in firmware, resident software, micro-code, or other software), or in a combination of software and hardware aspects that may all generally be referred to herein as a "system" and include circuit(s) and/or module(s).

Figure 6:
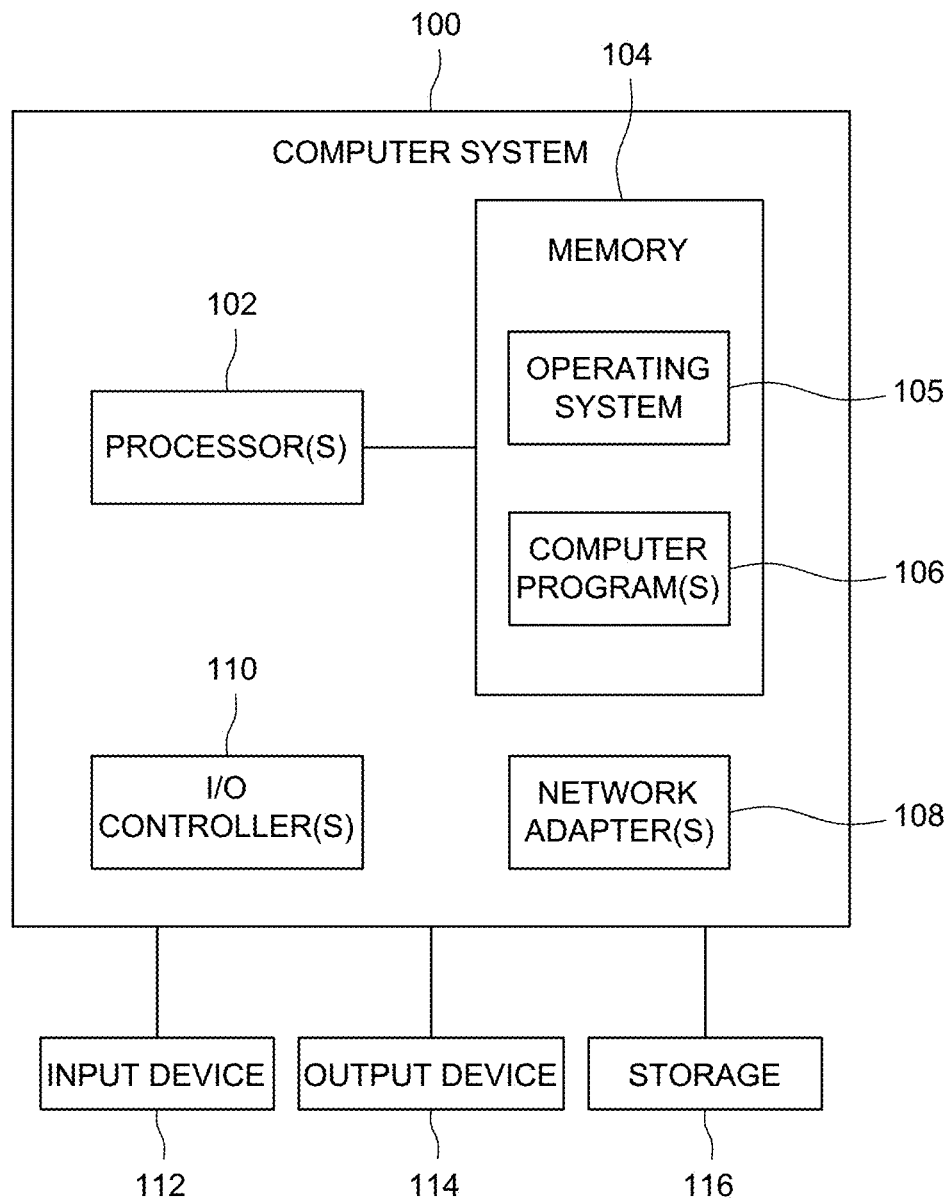
FIG. 6 depicts an exemplary computer system that may be utilized to generate internal structures according to the present disclosure.

FIG. 6 depicts one example of a computer system to incorporate and use one or more aspects of the present disclosure. Computer system 100 may be a computer enabled system such as additive manufacturing systems, including but not limited to, DMLM, DMLS, and electron beam melting and systems for producing, gathering and/or analyzing data used or generated by an AM system. Computer system 100 of FIG. 6 may be suitable for storing and/or executing program code, such as program code for defining and/or additively manufacturing the internal structures described above and includes at least one processor 102 coupled directly or indirectly (e.g. wirelessly, remotely, locally) to memory 104 through, a bus 120. In operation, processor(s) 102 may obtain from memory 104 instructions for execution by the processor(s). A non-limiting list of examples of memory 104 includes local or remote servers such as a cloud based system, or local devices such as, hand-held devices, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Memory 104 may include an operating system 105 and one or more computer programs 106, such as one or more programs for execution to perform processes described herein, such as defining and/or additively manufacturing the internal structures described above.

Input/Output (I/O) devices 112, 114 (such as peripheral devices) may be coupled to the system either directly or through I/O controllers 110. Network adapters 108 may also be coupled to the system to enable the computer system to become coupled to other local or remote computer systems such as the Industrial Internet or Cloud through intervening private or public networks. Modems, cable modem and Ethernet cards are just a few of the currently available types of network adapters 108. In one example, network adapters 108 facilitate obtaining data from remote sources to facilitate aspects of the processes described herein, such as receiving the first and/or second input files.

Computer system 100 may be coupled to storage 116 (e.g., a non-volatile storage area, such as magnetic disk drives, optical disk drives, a tape drive, or storage medium), having one or more databases. Storage 116 may include an internal storage device or an attached or network accessible storage. Computer programs in storage 116 may be loaded into memory 104 and executed by a processor 102.

The computer system 100 may include fewer components than illustrated, additional components not illustrated herein, or some combination of the components illustrated and additional components. Computer system 100 may include any computing device, such as a mainframe, server, personal computer, workstation, laptop, handheld computer, smartphone, table, or other mobile device, telephony device, network appliance, virtualization device, storage controller, or other computing device.

In addition, processes described above may be performed by multiple computer systems 100, working in concert as part of a computing environment.

In some embodiments, the processes described herein such as defining and/or additively manufacturing the internal structures, may take the form of a computer program product embodied in computer readable medium(s). The computer readable medium(s) may have embodied thereon computer readable program code. Various computer readable medium (s) or combinations thereof may be utilized. For instance, the computer readable medium(s) may include a computer readable storage medium, examples of which include (but are not limited to) one or more electronic, magnetic, optical, or semiconductor systems, apparatuses, or devices, or any suitable combination of the foregoing.

Figure 7:
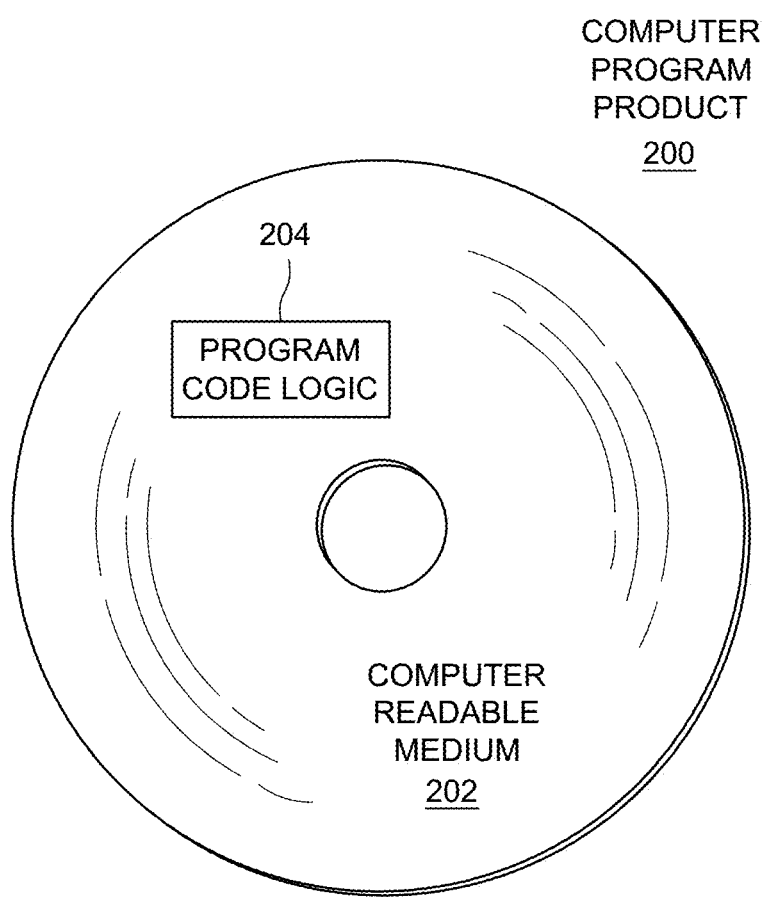
FIG. 7 depicts an embodiment of a computer program product that may incorporate aspects of the disclosure described herein.

Referring now to FIG. 7, in one example, a computer program product 200 includes, for instance, one or more computer readable media 202 to store computer readable program code means or logic 204 thereon to provide and facilitate one or more aspects of the processes described herein, such as defining and/or additively manufacturing the internal structures.

Program code contained or stored in/on a computer readable medium can be obtained and executed by a computer system (e.g., a computer or a computer system, including a component thereof) and/or other devices to cause the computer system, component thereof, and/or other device to behave/function in a particular manner. The program code can be transmitted using any appropriate medium, including (but not limited to) wireless, wireline, optical fiber, and/or radio-frequency. Program code for carrying out operations to perform, achieve, or facilitate aspects of the present processes, such as defining and/or additively manufacturing the internal structures, may be written in one or more programming languages. In some embodiments, the programming language(s) include object-oriented and/or procedural programming languages such as C, C++, C#, Java, or other languages. Program code may execute entirely on the user's computer, entirely remote from the user's computer, or a combination of partly on the user's computer and partly on a remote computer. In some embodiments, a user's computer and a remote computer are in communication via a network such as a local area network (LAN) or a wide area network (WAN), and/or via an external computer (for example, through the Internet using an Internet Service Provider).

In one example, program code includes one or more program instructions obtained for execution by one or more processors. Computer program instructions may be provided to one or more processors of, e.g., one or more computer system, to produce a machine, such that the program instructions, when executed by the one or more processors, perform, achieve, or facilitate aspects of the processes disclosed herein (e.g., defining and/or additively manufacturing the internal structures), such as actions or functions described in flowcharts and/or block diagrams described herein. Thus, each block, or combinations of blocks, of the flowchart illustrations and/or block diagrams depicted and described herein can be implemented, in some embodiments, by computer program instructions.

The flowcharts and block diagrams depicted and described with reference to the figures illustrate the architecture, functionality, and operation of possible embodiments of systems, methods and/or computer program products according to aspects of the present disclosure. These flowchart illustrations and/or block diagrams could, therefore, be of methods, apparatuses (systems), and/or computer program products according to aspects of the present disclosure.

In some embodiments, as noted above, each block in a flowchart or block diagram may represent a module, segment, or portion of code, which includes one or more executable instructions for implementing the specified behaviors and/or logical functions of the block. Those having ordinary skill in the art will appreciate that behaviors/functions specified or performed by a block may occur in a different order than depicted and/or described, or may occur simultaneous to, or partially/wholly concurrent with, one or more other blocks. Two blocks shown in succession may, in fact, be executed substantially concurrently, or the blocks may sometimes be executed in the reverse order. Additionally, each block of the block diagrams and/or flowchart illustrations, and combinations of blocks in the block diagrams and/or flowchart illustrations, can be implemented wholly by special-purpose hardware-based systems, or in combination with computer instructions, that perform the behaviors/functions specified by a block or entire block diagram or flowchart.

The terminology used herein is for the purpose of describing particular embodiments only and is not intended to limit the disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The present disclosure has been presented for purposes of illustration and description, but is not intended to be exhaustive or limiting. Many modifications and variations will be apparent to those of ordinary skill in the art without departing from the scope and spirit of the disclosure. The embodiment was chosen and described in order to best explain the principles of one or more aspects of the disclosure and the practical application, and to enable others of ordinary skill in the art to understand one or more aspects of the disclosure for various embodiments with various modifications as are suited to the particular use contemplated.

Unless defined otherwise, all technical and scientific terms used herein have the same meaning as commonly understood by one of ordinary skill in the art to which the disclosure pertains. Although a number of methods and materials similar or equivalent to those described herein can be used in the practice of the present disclosure, the preferred materials and methods may be described herein.

As will be appreciated by one having ordinary skill in the art, the methods and compositions of the disclosure substantially reduce or eliminate the disadvantages and drawbacks associated with prior art methods and compositions.

As required, detailed embodiments of the present disclosure may be disclosed herein; however, it is to be understood that the disclosed embodiments may be merely exemplary of the disclosure, which may be embodied in various forms. Therefore, specific structural and functional details disclosed herein may be not to be interpreted as limiting, but merely as a basis for the claims and as a representative basis for teaching one skilled in the art to variously employ the present disclosure in virtually any appropriately detailed structure.

While it is apparent that the disclosed illustrative embodiments fulfill aspects stated above, it will be appreciated that numerous modifications and other embodiments may be devised by one of ordinary skill in the art. Accordingly, it will be understood that the appended claims may be intended to cover all such modifications and embodiments, which come within the spirit and scope of the present disclosure.

We claim:

1. A method of defining a plurality of internal secondary structures of an object, to be formed at least in part by additive manufacturing, comprising a primary structure having a volume, comprising:
   specifying a tagged surface that bounds the volume;
   applying a balancing parameter within an axis-aligned bounding box that encompasses the primary structure;
   refining the balancing parameter based on the tagged surface, a predetermined targeted cell size, and a maximum cell size until the volume is delimited into a plurality of cells, wherein the axis-aligned bounding box is refined to include at least one minimum-size cell based on the predetermined targeted cell size, the at least one minimum-size cell intersecting the tagged surface, and wherein a rate of cell size transition between neighboring cells of the plurality of cells is based on the balancing parameter and the predetermined targeted cell size;
   generating a virtual representation of a plurality of the internal secondary structures based on the plurality of cells, the internal secondary structures including a plurality of beam elements that are each at least one of one-dimensional, two-dimensional, or three-dimensional beam elements; and
   merging collinear beam elements into single beam elements.

2. The method of claim 1, wherein at least one of the internal secondary structures intersects the tagged surface.

3. The method of claim 1, further comprising orienting a plurality of the internal secondary structures at an angle to a global z-axis that is substantially parallel to a build direction.

4. The method of claim 3, wherein the angle to the global z-axis in a range of greater than 45 degrees to less than or equal to 70 degrees.

5. The method of claim 3, wherein the angle to the global z-axis is about 55 degrees.

6. The method of claim 1, wherein at least some of the internal secondary structures comprise a lattice.

7. The method of claim 1, wherein the balancing parameter comprises an octree balancing parameter.

8. The method of claim 1, wherein refining comprises applying an embedded Cartesian grid method.

9. The method of claim 1, wherein a plurality of the beam elements form a lattice structure.

10. The method of claim 1, wherein one or more of the cells comprise the beam elements.

11. The method of claim 1, wherein at least one beam element has an end point that lies completely outside of the volume, the method further comprising trimming the outlying beam elements by moving the end point of the at least one beam element to a corresponding intersection.

12. A method of defining a plurality of internal secondary structures of an object, to be formed at least in part by additive manufacturing, comprising a primary structure having a volume, comprising:
   specifying a tagged surface that bounds the volume;
   applying a balancing parameter within an axis-aligned bounding box that encompasses the primary structure; and
   refining the balancing parameter based on the tagged surface, a predetermined targeted cell size, and a maximum cell size until the volume is delimited into a plurality of cells, wherein the axis-aligned bounding box is refined to include at least one minimum-size cell based on the predetermined targeted cell size, the at least one minimum-size cell intersecting the tagged surface, and wherein a rate of cell size transition between neighboring cells of the plurality of cells is based on the balancing parameter and the predetermined targeted cell size; and
   generating a virtual representation of a plurality of the internal secondary structures based on the plurality of cells, whereby a plurality of the internal secondary structures are oriented at an angle to a global z-axis that is substantially parallel to a build direction in a range of greater than 45 degrees to less than or equal to 70 degrees.

13. The method of claim 12, wherein one or more of the cells comprise beam elements that are collinear, and wherein the method comprises combining collinear beam elements into a single beam element.

14. The method of claim 12, wherein the angle to the global z-axis is in a range of 50 degrees to 60 degrees.

15. The method of claim 12, wherein the angle to the global z-axis is about 55 degrees.

* * * * *